United States Patent
Houston et al.

(10) Patent No.: US 6,787,469 B2
(45) Date of Patent: Sep. 7, 2004

(54) DOUBLE PATTERN AND ETCH OF POLY WITH HARD MASK

(75) Inventors: Theodore W. Houston, Richardson, TX (US); Robert A. Soper, Plano, TX (US); Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/227,615

(22) Filed: Aug. 23, 2002

(65) Prior Publication Data

US 2003/0124847 A1 Jul. 3, 2003

Related U.S. Application Data

(60) Provisional application No. 60/344,631, filed on Dec. 28, 2001.

(51) Int. Cl.[7] .................... H01L 21/302; H01L 21/461

(52) U.S. Cl. .................................................... 438/689
(58) Field of Search ........................ 216/2, 6, 13, 58, 216/83, 96; 430/310, 316; 438/689, 706–712, 725, 736, 745, 746

(56) References Cited

U.S. PATENT DOCUMENTS 6,472,258 B1 * 10/2002 Adkisson et al. ........... 438/192

* cited by examiner

*Primary Examiner*—Ernest Karlsen
*Assistant Examiner*—Asok Kumar Sarkar
(74) *Attorney, Agent, or Firm*—Peter K. McLarty; W. James Brady, III; Frederick J. Telecky, Jr.

(57) ABSTRACT

A system for fabricating a mixed voltage integrated circuit is disclosed in which a gate is provided that contains a gate oxide and a gate conductor on a substrate. A first mask is deposited to pattern the length of the gate by etching, and a second mask pattern is deposited and used to etch the width of the gate, with or without a hard mask.

23 Claims, 6 Drawing Sheets

DOUBLE PATTERN AND ETCH OF POLY WITH HARD MASK

This application claims priority from Provisional Application Ser. No. 60/344,631, filed on Dec. 28, 2001.

TECHNICAL FIELD OF THE INVENTION

The present invention relates in general to the field of semiconductor device fabrication and, more particularly, to a system for optimizing the manufacture of short gate lengths.

BACKGROUND OF THE INVENTION

Manufacturing cost of an integrated circuit is largely dependent upon the chip area required to implement desired functions. A chip area is defined by the geometries and sizes of active components disposed on a wafer substrate. Active components include gate electrodes in metal-oxide semiconductors (MOS), and diffused regions such as MOS source and drain regions, and bipolar emitters, collectors and base regions. The geometries and sizes of these features are often dependent upon the photolithographic resolution available for the particular equipment used in processing the integrated circuit.

Photolithography typically relies on a mask and a light source to expose and pattern an underlying photoresist layer for use with, e.g., etching steps. The photoresist may be either a positive or negative photoresist. After exposure, the exposed (positive) or unexposed (negative) portions of the photoresist are removed leaving a patterned layer of photoresist for the next process step. When forming minute patterns, for ultra large scale integration (ULSI) devices, a projection and reduction exposure method is typically used. Projection and reduction is useful for ULSI as very small patterns can be resolved because mask precision is also reduced.

A significant problem of conventional photolithographic techniques as applied to ULSI, as more and more layers are added, is that additional steps add additional complexity to the creation of circuits on the wafer surface. The resolution of small image sizes in photolithography becomes more difficult due to light reflection and the thinning of the photoresist during processing.

As a two dimensional process used to achieve a three dimensional structure, the goal of photolithographic patterning is to establish the horizontal and vertical dimensions of the various devices and circuits used to create a pattern that meets design requirements—such as correct alignment of circuit patterns on the wafer surface. As line widths shrink, photolithography of patterns down to the nanometer level, and smaller, approach the limits of resolution of present equipment. These sub-nanometer line widths become increasingly more difficult to pattern because of the limits of the wavelength of light used for exposure.

SUMMARY OF THE INVENTION

The present invention recognizes the need for reduced polysilicon gate line-end loss in ULSI integrated circuits. As gate surface areas and spacing are reduced, so are margins between adjacent devices. Spacing problems are further accentuated at the end of lines created using conventional and phase shift photolithography, due to light scatter at the line-end corners. Also, techniques to reduce gate length tend to increase line-end loss. In order to permit devices to be closer together, the spacing between lines must be reduced. Line-end loss increases final spacing between lines, limiting reductions in spacing between devices.

Current use of alternate phase shift photolithography attempts to reduce gate length by using two phase shift patterns (0 and 180 degree) in the gate regions. A second exposure is used to define other regions, including line-ends.

The present invention uses two photolithographic masks. However, the two masks of the present invention are optimized to reduce gate length (width of the patterned line), while also decreasing line-end loss.

More particularly, the present invention provides for producing a gate on a substrate, wherein a first mask is used to pattern the width of the polysilicon and a second mask is used to pattern the line-end cuts prior to polysilicon etching. The present invention results in a significant decrease in the line-end loss critical to maintaining the dimensions of the polysilicon. Thus, the system of the present invention provides a reduction in end loss and device variation, with the same number of processing steps and with the attendant increase in efficiency and yield.

The present invention optimizes the line-ends by, e.g., reducing the corner rounding and line-end pull back caused by scattered light, and by separate optimization of the spacing and the width of the exposure. The present invention provides both high reliability and high performance. The masks created for the present invention may be formed consistently using existing process equipment, processes and workflows. The first and second masks may also be used with existing techniques and materials without the need to implement new processes or upgrade current equipment.

BRIEF DESCRIPTION OF THE DRAWINGS

For a more complete understanding of the features and advantages of the present invention, reference is now made to the detailed description of the invention along with the accompanying FIGUREs in which corresponding numerals in the different FIGUREs refer to corresponding parts and in which.

DETAILED DESCRIPTION OF THE INVENTION

While the making and using of various embodiments of the present invention are discussed in detail below, it should be appreciated that the present invention provides many applicable inventive concepts that may be embodied in a wide variety of specific contexts. The specific embodiments discussed herein are merely illustrative of specific ways to make and use the invention and are not to delimit the scope of the invention.

The present invention is described in conjunction with SRAM (Static Random Access Memory) fabrication. It may also be used with fabrication of digital signal processors (DSPs), or a number of other types of semiconductor devices. A SRAM cell is used to illustrate the invention, but the invention is applicable to other types of non-memory, mixed DSP-memory, memory or other circuits.

The present invention provides a separate sequence of patterning for width and line-ends (e.g., of a polysilicon pattern), followed by further processing (e.g., etch). In one embodiment, a hard mask is formed as gate length (i.e., polysilicon width) is defined first—including, where necessary, steps such as etch back, to reduce the gate length in the hard mask. A second pattern is formed on the hard mask, optimizing to reduce feature spacing. In one embodiment of the invention, one may use attenuated, versus alternating, phase shift to define the gate length. Attenuated phase shift has cost advantages and avoids possible phase conflicts of alternating phase lithography. Alternating phase lithography is, however, superior for forming narrow patterns. The present invention provides a first photoresist patterning sequence that is optimized to provide a narrow, well-defined polysilicon width for short gate lengths. A second photoresist patterning sequence is optimized to provide narrow spaces at the polysilicon ends. Photoresist for use with the present invention may be, for example, a novolak.

The invention applies to any process for formation of any structure requiring both narrow width and narrow end spacing, such as a FET gate. In particular, the invention applies to the formation of gates in an SRAM cell. The gate may be formed of any material, and may be formed directly by etch of deposited material, or may be formed by replacement gate processes, or by a damascene process.

Figure 1:
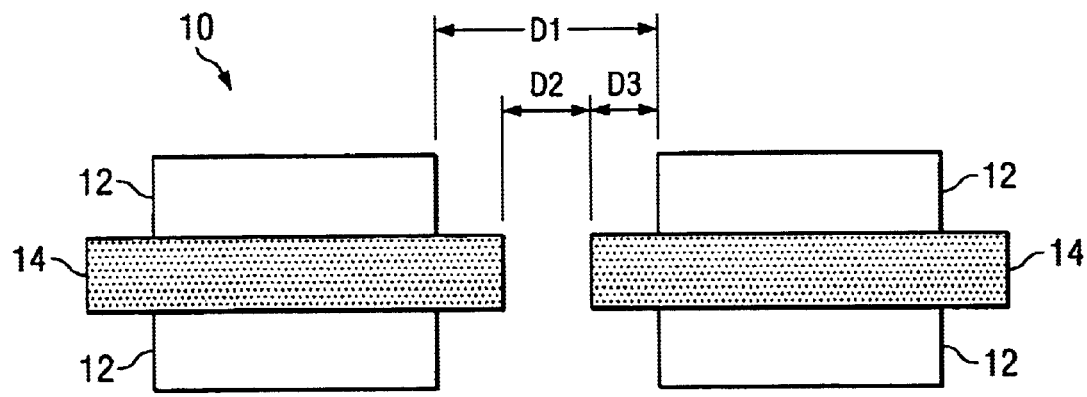
FIG. 1 is a top view illustration of a line-end and adjacent fields.

FIG. 1 depicts a top view of two adjacent transistors illustrating a pattern in which line-end loss is critical. The integrated circuit 10 is depicted with active regions 12 underlying polysilicon lines 14. One limitation of ULSI and VLSI devices concerns the distance between the active regions 12 at distance D1. D1 is set by the spacing between line-ends, D2, and the extension of gate beyond the underlying active, D3. Reduction of D2 is limited by the ability to pattern line-end spacing. D3 must be large enough to maintain full line width, with an overlap of gate over active at the transistor edges, and with an allowance for misalignment and line-end pull back.

In prior art methods, where a single pattern is used to define the polysilicon geometry, line-end loss occurs both because of corner effects and because the optimization to get a narrow line width is not optimum for minimizing line-end spacing.

Figure 2:
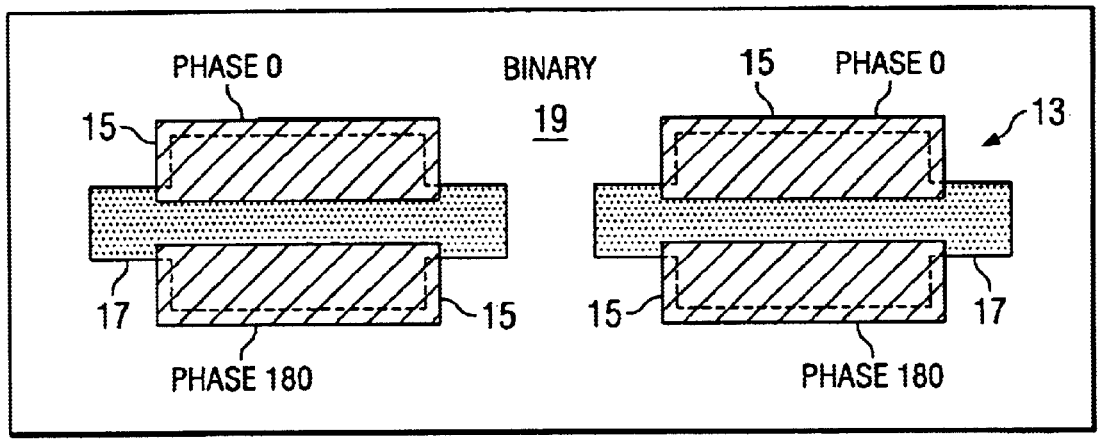
FIG. 2 is a top view illustration of a PRIOR ART alternating phase shift pattern for defining line width and a binary pattern for defining line-end.

FIG. 2 illustrates a prior art design having a combination of an alternating phase shift pattern 15 and a binary pattern 19, and depicts polysilicon line 13 with line-ends 17. The opposite sides of the gate 17 in the active region are defined by opposite phase regions (0 degree phase and 180 degree phase). The line-ends 17 are surrounded by the binary trim pattern depicted in FIG. 2. Light scatter and diffraction at the interior corners of the binary pattern lead to rounded corners and line-end pull-back. Misalignment of the binary pattern relative to the alternating phase shift pattern also strongly affects the final gate pattern. The overlap between the patterns is shown as a dashed line, which allows for misalignment.

In contrast now, FIGS. 3a–3e illustrate exposure patterns 22, according to the present invention, after a first photolithographic pattern step over a polysilicon line 20. Line-ends 16 are surrounded by holes in binary trim pattern 26 that form a hammerhead-like structure. According to the present invention, binary pattern 26 does not surround line-end 16, but instead cuts straight across. Thus, opposite edges of gate 28 are fully defined by the alternating phase patterns 22 and 26. These patterns allow for separate optimization of line width (i.e., gate length) and line-end spacing, and minimization of corner rounding and line-end pull back.

While the above description demonstrates the use of a "positive" process for the binary trim mask (i.e., one in which clear areas on a trim mask (holes) produce spaces on the wafer), those of skill in the art will recognize that a "negative" process may also be used. For example, in some "negative" processes, chrome areas on a reticle produce spaces on a wafer. Either a positive or negative process implementation may be used in accordance with the present invention.

Figure 3A:
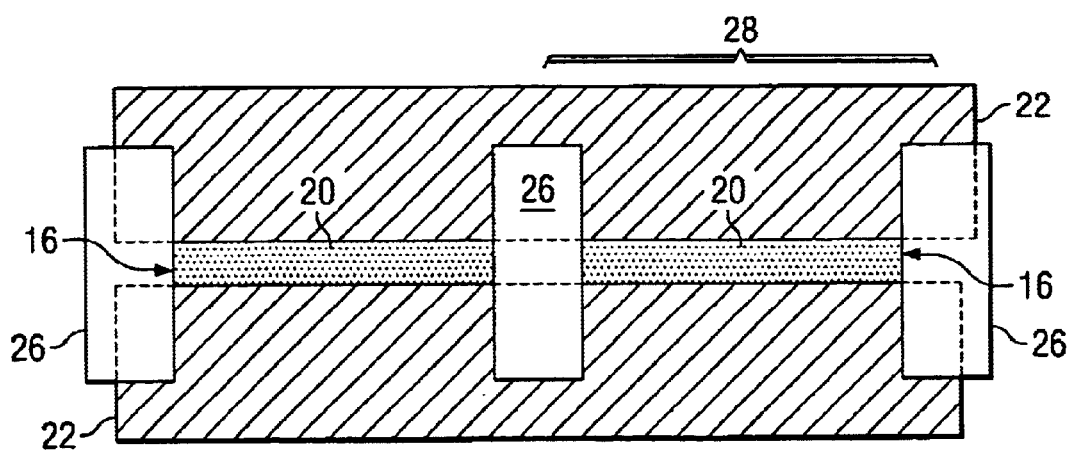
FIGS. 3a, 3b, 3c, 3d, and 3e are top view illustrations of patterns for defining the width of a line according to the present invention.

In FIG. 3a, the alternating phase patterns 22 maintain a uniform spacing through end 16 of line 20. While the shape of the patterns in FIG. 3a is the most insensitive to misalignment between the phase 22 and binary 26 patterns, other shapes may prove necessary to optimize the line-ends for certain transistor designs. In particular, the pattern in FIG. 3a can sometimes cause gates 28 to narrow too quickly after passing off of the active regions. Narrowing is most common in dual-exposure, single-resist patterning because both the "slot" binary hole phase apertures contribute light in the region near the binary hole.

Figure 3B:
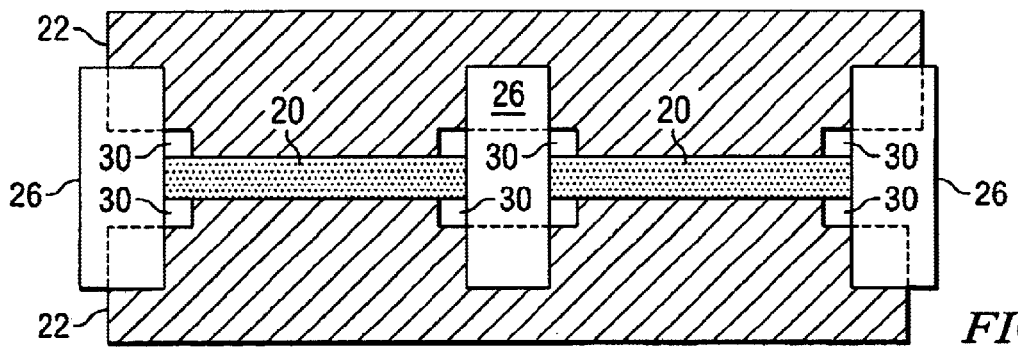

As illustrated in FIG. 3b, it is sometimes desirable to cause the spacing between alternating phase apertures 22 to widen 5 in proximity to slot 30. Although somewhat counter-intuitive, this allows ends 16 to be patterned more closely together while maintaining a minimum width for as far as possible past the active edge.

Figure 3C:
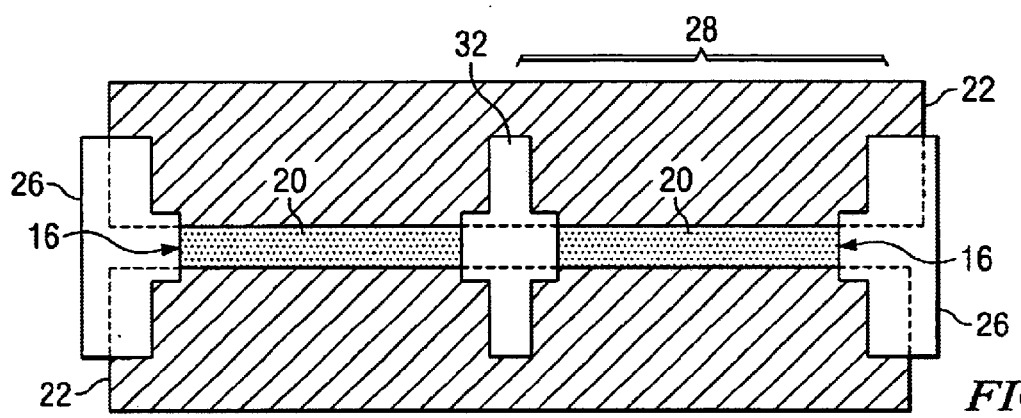

Similarly, a more complex shape to the "hole" in binary pattern 26 may also allow ends 16 to approach more closely in the final printed pattern, while maintaining a minimum width as far as possible past the active edge. FIG. 3c illustrates one such complex shape, where the hole is wider at ends 16 of gates 28 than immediately above and below gate 28.

In particular, the combination of widening the phase-to-phase spacing and forming a cross-like hole 32 can be combined to further optimize the gate ends for extension over active and correct width beyond active.

Figure 3D:
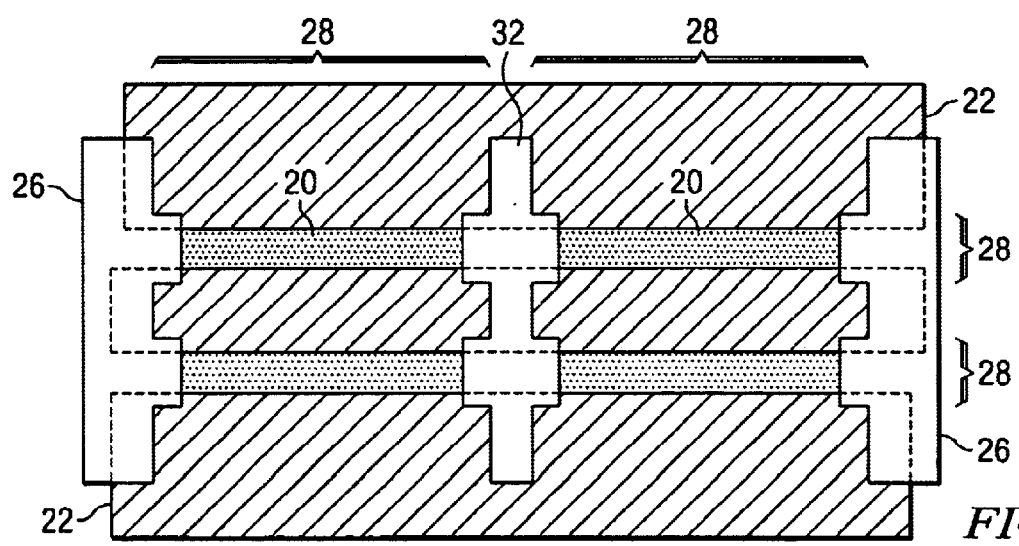
Figure 3E:
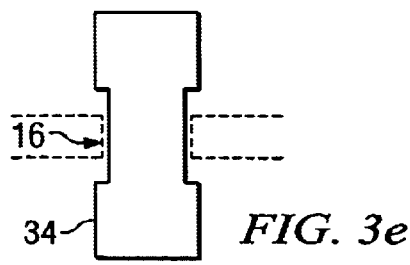

When transistors are closely placed, as in an illustrative SRAM structure, the above "holes" and phase notches may combine to yield the optimum shape. FIG. 3d illustrates this for two pairs of transistors 28 closely spaced while using both the "widened" phase distance near end 16 and combining two "cross-like" holes 32 to separate the ends of both transistor 28 pairs. The center phase block has notches on both sides to simultaneously "widen" both the transistor pair above and below. Similarly the "two" cross openings overlap to form a single opening with a distinctive "key hole" shape. The "key hole" shape is only one possibility and two simple slots could also be combined for a single simple slot cutting two transistor-pair ends. FIG. 3e illustrates an alternative shape 34 for a pattern defining ends 16.

Figure 4A:
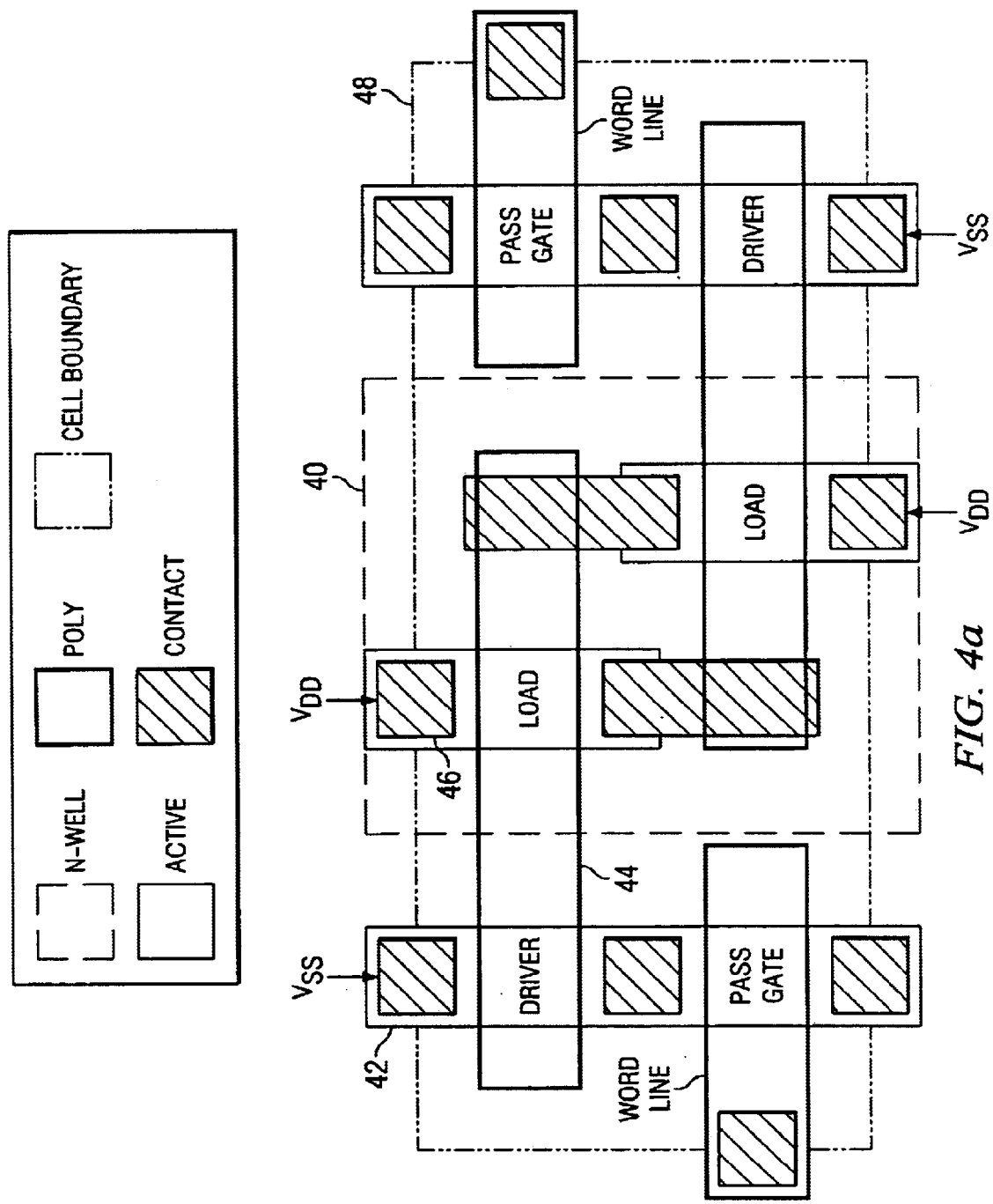
FIGS. 4a, 4b, 4c, 4d, and 4e are illustrations show of an SRAM cell using separate patterns for defining gate lengths and gate ends according to the present invention.
Figure 4B:
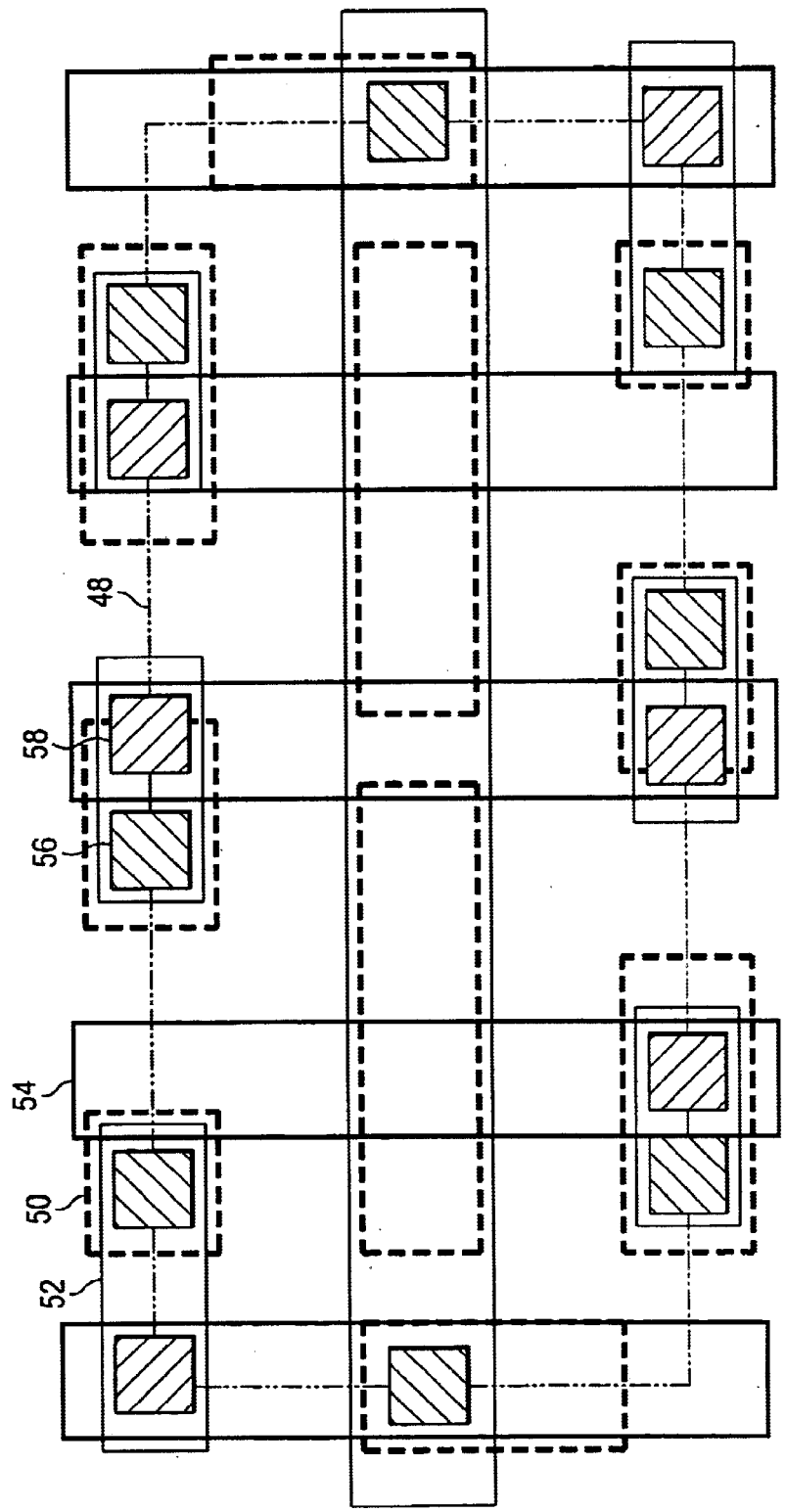
Figure 4C:
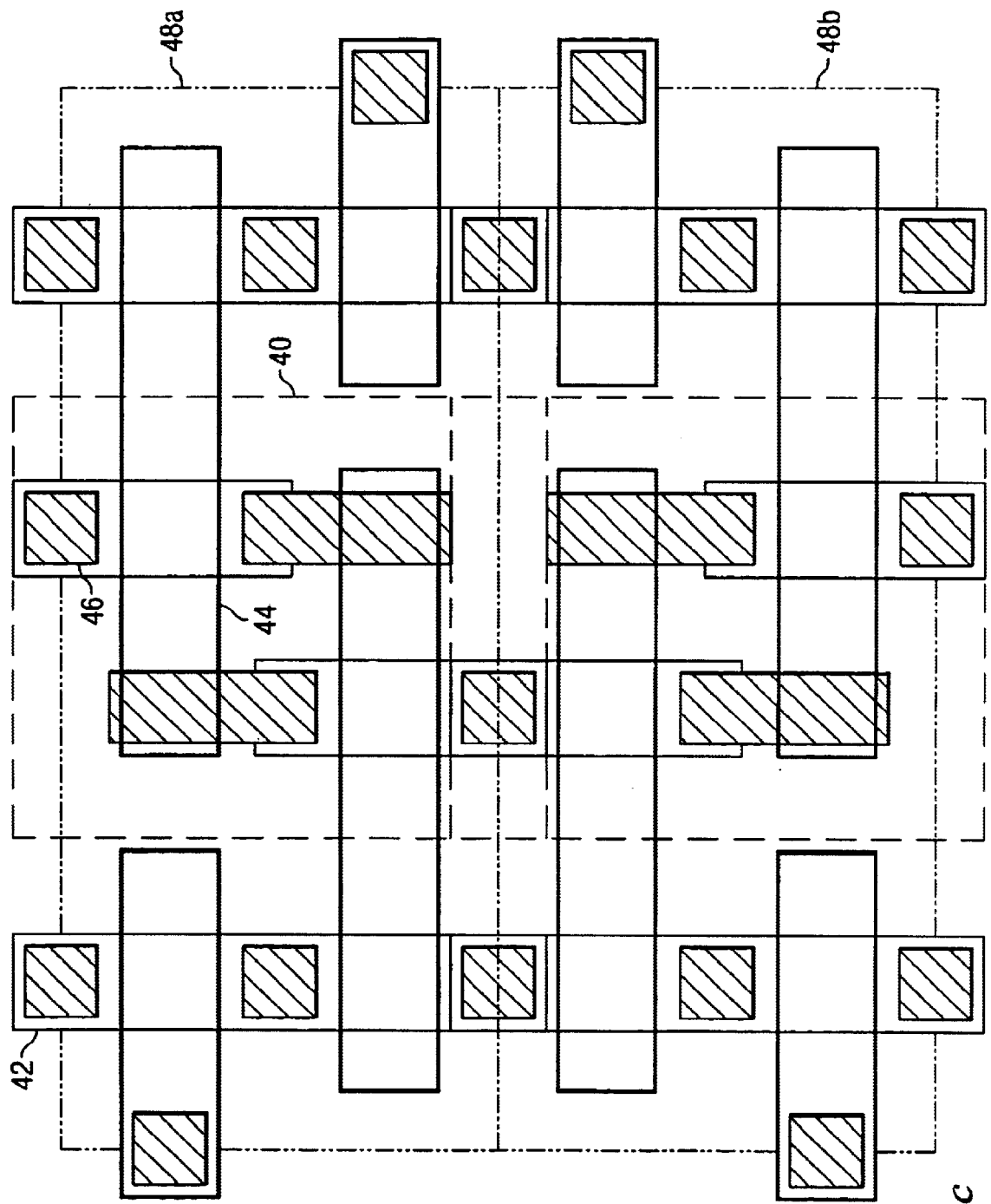

FIG. 4a illustrates n-well 40, active 42, gate 44, and contact 46 levels of a six transistor SRAM cell, particularly adapted to the use of separate patterns for gate length and line-end. Electrical nodes are identified by cell boundary 48. Metal levels are omitted from the illustration for clarity. Associated metal levels 50, 52, and 54, and via levels 56, 58 are shown in FIG. 4b with the cell boundary 48. FIG. 4c illustrates the n-well 40, active 42, gate 44, and contact 46 levels for two adjacent cells 48a and 48b. To form an array, cells 48a and 48b can be stepped vertically and mirrored and stepped horizontally.

Figure 4D:
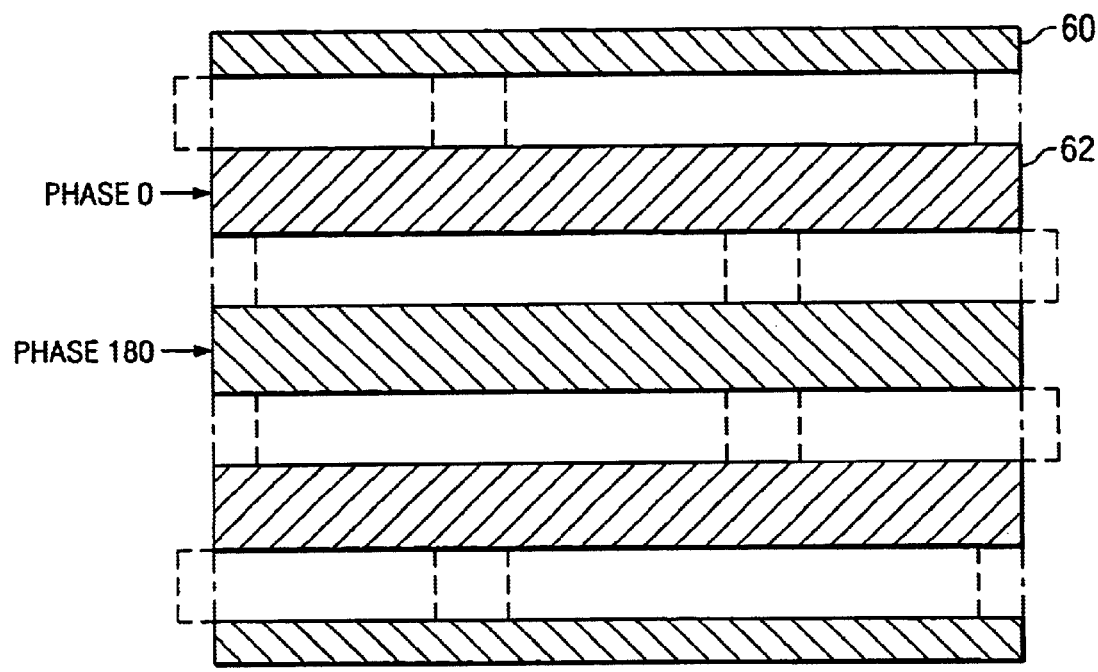
Figure 4E:
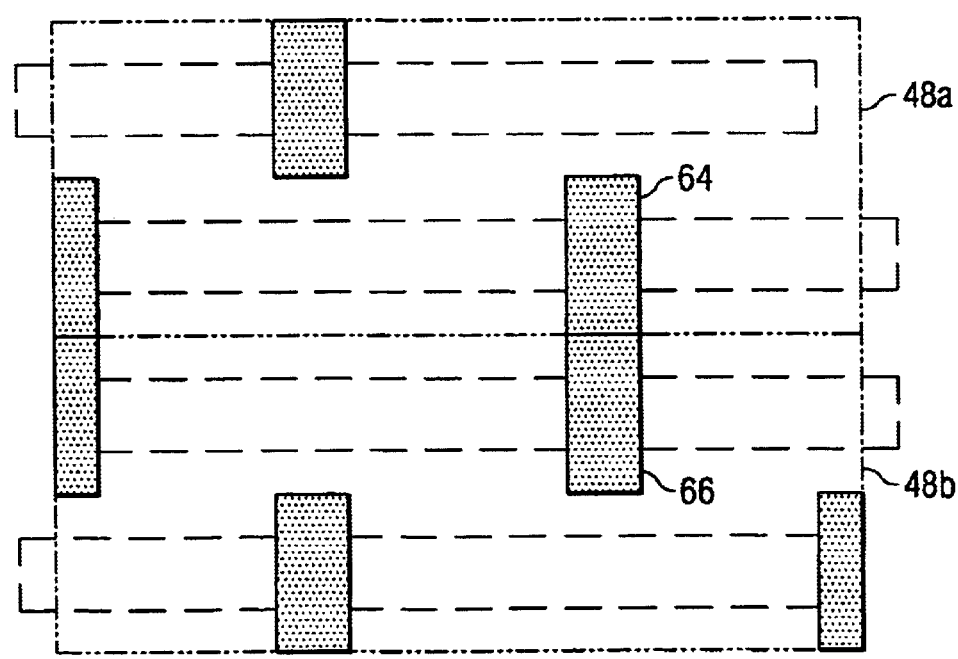

FIG. 4d illustrates patterns 60 and 62 that may be used define gate lengths using alternating phase shift lithography. The patterns utilize stripes that extend across the array in the wordline direction. While shown as uniform width stripes, the widths of the stripes can vary, for example to have different gate lengths for different transistors, or to adjust for line-ends (as in FIG. 3b). FIG. 4e shows complementary line-end patterns 54 and 56 for two adjacent SRAM cells 48a and 48b. While shown as simple rectangles for purposes of this example, other shapes may be used, e.g., those shown in FIGS. 3a–3e, and 4a–4e, may be used.

Those of skill in the art will appreciate that the actual shapes printed on reticles may vary from the shapes as designed. In effect, during the making of a reticle, designed shapes (e.g., square, circle, oval or a rectangle) will substantially maintain their form in the final reticle. All the variations and derivatives of such shapes are encompassed by the present invention.

One distinct advantage of using two photolithographic pattern steps is that they may each be optimized in length and intensity to create the best possible line definition. For example, the length of the first or the second photolithographic patterning step may be lengthened or shortened to maximize the contrast of the deposition. As will be apparent to those of skill in the art, either pattern may be deposited first. In fact, one photoresist may be patterned in one step and a different photoresist in the second step. Using this system, the type of photoresist may be selected to maximize and optimize the efficiency of etching and processing.

By using separate exposure and development sequences and patterns of photoresist the present invention reduces the effect of light scatter, e.g., rounding corners. Photoresist tends to round at corners, therefore, having the line-end corners formed by two intersecting developed patterns results in less corner rounding and reduced line-end pull back, e.g., of the polysilicon gate end. Having separate exposures allows having one pattern use a relatively high exposure and the other a relatively low exposure so as to have one minimize the width and the other minimize the space. Furthermore, separate etch sequences allows optimization of a first etch to reduce the width relative to the developed pattern, and optimization of the second etch to reduce line-end pull back. When implemented with complementary phase shift lithography, two exposure sequences are used anyway, so there is no added lithography step involved in the implementation of the present invention. Furthermore, present processing equipment, materials and processes may be used to provide reduced line-end loss, while at the same time increasing the operational life of equipment, reducing equipment replacement costs.

In one example of the present invention, there are two exposures and a single development of the resist. In another example of the present invention, there are two separate exposure and development sequences. In yet another example of the present invention, the etch step is performed in conjunction with a hard mask sequence. Using a hard mask where the hard mask is sufficiently thin, the hard mask may be etched twice (once with each pattern) and the poly etched once.

For a damascene process in which a trench is formed, the trench etch may be masked by the combination of a hard mask that is patterned and etched first and resist that is patterned and developed second. For example, a hard mask can be patterned to cover the space at line ends. Subsequently, resist can be deposited and patterned to define the line edges, covering the area not to be etched not already covered by the hard mask. An etch back can be used to reduce the width of the hard mask prior to deposition of the second resist. The surface can be planarized, for example by deposition and planarization of dielectric material after formation of the hard mask and prior to deposition of the second photo resist.

The present invention also reduces polysilicon line-end spacing and reduces polysilicon over-hang of active polysilicon, which at the gate line-end are allowed, resulting in more compact layouts. The present invention allows for area reduction with wider transistors in the illustrated SRAM cell topology. When using a hard-mask, the need to deal with the polysilicon topology is reduced for the second pattern. Use of the double-develop, single-etch sequence, simplifies greatly the polysilicon line-end etch process. The process of the present invention may also be combined with sidewall and etch-back sequences, which permit combination of sub-lithographic space and sub-lithographic width optimization.

The system of the present invention may be used to define the line end and line width of a polysilicon gate, or any patterned and etched device or compound. Polysilicon is used as an example. First, the polysilicon gate is defined with two patterns: (1) Width (gate length), which may be with alternating phase; and (2) the ends, which may be using, e.g., a binary pattern. Optionally, attenuating phase shift lithography may be used with either pattern. Optionally, a hard-mask may be used with a double etch of the hard mask and a single etch of the underlying material. As a further option, a hard mask may be used in conjunction with separately patterned resist to mask etch of underlying material. When performing the polysilicon width (gate length) pattern, the etch may be biased to reduce the polysilicon width, thereby creating a finer line pattern. When performing the end etch, the bias may be optimized to minimize the spacing. These biases are opposite, which gives the advantage of performing the pattern steps separately.

By developing the photoresist patterns separately (new resist for the second pattern where either Width or End pattern may be first) the lithographic corner rounding effect is reduced. The present invention reduces the rounding effect because light scattering into the region that is not to be exposed from both sides intersecting at a corner is reduced. This is particularly the case if one, the other, or both of the patterns are stepped away from the corner at the line end.

The second pattern may also define the width in regions where the short gate length is not needed, such as in runs of polysilicon over the oxide field. The "end" etch biases may be more appropriate for polysilicon over the oxide field segments, allowing tighter polysilicon spacing over the field.

One illustrative flow may comprise the following steps: pattern and etch the line end space in a hard mask; add sidewall to make the space narrower; and pattern and etch gate length in hard mask and continue to etch polysilicon.

While this invention has been described with reference to illustrative embodiments, it is not intended that this description be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method of fabricating an integrated circuit, comprising the steps of:

disposing a layer of material on a substrate;

forming a first pattern to define opposing sides of an area in the material;

forming a second pattern, substantially crossing the first pattern, to define an end of the area in the material, where the second pattern is substantially orthogonal to the first pattern at a point where the patterns cross; and etching the material as defined by the first and second patterns.

2. The method of claim 1, wherein the material is the conductive material of a transistor gate.

3. The method of claim 2, further comprising the step of etching the material to create an interconnect.

4. The method of claim 1, wherein the pattern in the material is a trench.

5. The method of claim 1, further comprising the step of forming a hard mask on said material before the patterning steps.

6. The method of claim 5, wherein one of the first pattern and the second pattern is formed in the hard mask.

7. The method of claim 1, wherein the first pattern comprises stripes of alternating phase.

8. The method of claim 1, wherein the first pattern comprises an exposure that is different from the exposure of the second pattern.

9. A method of fabricating an integrated circuit, comprising the steps of:

etching an opening in a hard mask with a first pattern;

adding a sidewall narrowing the opening;

etching to remove material in the hard mask, with a second pattern, leaving hard mask material on opposite sides of the narrowed opening; and etching underlying material as masked by the remaining hard mask.

10. The method of claim 9, further comprising a fill and planarization step between the first pattern and the second pattern steps.

11. The method of claim 9, wherein the first pattern comprises an exposure that is different from the exposure of the second pattern.

12. A method of forming a memory array comprising the steps of:

providing a first pattern, comprising stripes, defining transistor gate length;

providing a second pattern defining gate ends; and forming gates within the memory array using the first and second patterns.

13. The method of claim 12, wherein the first pattern is substantially orthogonal to the second pattern at points where the patterns cross.

14. The method of claim 12, wherein the first pattern comprises stripes of alternating phase.

15. The method of claim 12, wherein the spacing between the stripes widens at gate ends.

16. The method of claim 12, wherein the pattern defining gate ends comprises simple rectangles.

17. The method of claim 12, wherein the pattern defining gate ends has narrow regions, and wide regions in the area between gate ends.

18. A method of fabricating an integrated circuit, comprising the steps of:

etching an area in a hard mask with a first pattern;

etching to reduce the width of the area;

etching to remove additional material in the hard mask with a second pattern;

etching underlying material as masked by the remaining hard mask.

19. The method of claim 18, wherein the first pattern comprises stripes of alternating phase.

20. The method of claim 18, wherein the spacing between the stripes widens at gate ends.

21. The method of claim 18, wherein the pattern defining gate ends comprises simple rectangles.

22. The method of claim 18, wherein the pattern defining gate ends has narrow regions, and wide regions in the area between gate ends.

23. The method of claim 18, wherein the pattern defining gate ends has wide regions, and narrow regions in the area between the gate ends.

* * * * *